(12) United States Patent
Wang et al.

(10) Patent No.: US 11,901,367 B2
(45) Date of Patent: Feb. 13, 2024

(54) ARRAY SUBSTRATE AND METHOD OF MANUFACTURING THE SAME, AND DISPLAY APPARATUS

(71) Applicant: BOE TECHNOLOGY GROUP CO., LTD., Beijing (CN)

(72) Inventors: Yan Wang, Beijing (CN); Yanqing Chen, Beijing (CN); Wei Li, Beijing (CN); Ning Wang, Beijing (CN); Weida Qin, Beijing (CN); Zhao Zhang, Beijing (CN); Jing Li, Beijing (CN); Feng Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/788,024

(22) PCT Filed: May 12, 2021

(86) PCT No.: PCT/CN2021/093430
§ 371 (c)(1),
(2) Date: Jun. 22, 2022

(87) PCT Pub. No.: WO2021/254043
PCT Pub. Date: Dec. 23, 2021

(65) Prior Publication Data
US 2023/0027406 A1    Jan. 26, 2023

(30) Foreign Application Priority Data

Jun. 19, 2020    (CN) .......................... 202010567638.9

(51) Int. Cl.
*H01L 27/12*    (2006.01)
*G02F 1/1362*    (2006.01)
*G02F 1/1368*    (2006.01)

(52) U.S. Cl.
CPC ........ *H01L 27/1218* (2013.01); *G02F 1/1368* (2013.01); *G02F 1/136209* (2013.01);
(Continued)

(58) Field of Classification Search
CPC ............. H01L 27/3244; H01L 27/3276; H01L 27/3262; H01L 27/3246; H01L 51/0097;
(Continued)

(56) References Cited

U.S. PATENT DOCUMENTS

| 2004/0007704 A1* | 1/2004 | Kim ................... G02F 1/133555 438/149 |
| 2006/0060858 A1* | 3/2006 | Park .................... H01L 27/1288 257/E29.151 |

(Continued)

FOREIGN PATENT DOCUMENTS

| CN | 103199084 A | 7/2013 |
| CN | 104932163 A | 9/2015 |

(Continued)

OTHER PUBLICATIONS

First Office Action for Chinese Patent Application No. 202010567638.9 issued by the Chinese Patent Office dated Mar. 23, 2023.

*Primary Examiner* — Hoan C Nguyen
(74) *Attorney, Agent, or Firm* — IP & T GROUP LLP

(57) ABSTRACT

A method of manufacturing an array substrate, includes: providing a substrate; forming a gate conductive layer including at least one first alignment mark; forming a source-drain conductive thin film; aligning a first mask and the substrate on which the gate conductive layer and the source-drain conductive thin film have been formed according to the at least one first alignment mark; patterning the source-drain conductive thin film by using the first mask to form at least one second alignment mark to obtain a source-drain conductive layer; forming a black matrix thin film;

(Continued)

aligning a second mask and the substrate on which the gate conductive layer, the source-drain conductive layer and the black matrix thin film have been formed according to the at least one second alignment mark; patterning the black matrix thin film by using the second mask to form a black matrix; and forming a color filter layer.

8 Claims, 10 Drawing Sheets

(52) U.S. Cl.
CPC ...... *G02F 1/136222* (2021.01); *H01L 27/127* (2013.01); *H01L 27/1288* (2013.01)

(58) Field of Classification Search
CPC ............. H01L 27/3248; H01L 29/4908; H01L 29/66757; H01L 27/12; H01L 29/786; H01L 27/3211; H01L 29/66765; H01L 29/41733; H01L 27/3272; H01L 51/5203; H01L 21/467; H01L 21/266; H01L 27/11803; G02F 1/136286; G02F 1/133514; G02F 1/133512; G02F 1/134363; G02F 1/136227; G02F 1/13338; G02F 1/1343; G02F 2201/123; G02F 1/136209; G02F 1/134318; G02F 1/13685
See application file for complete search history.

(56) References Cited

U.S. PATENT DOCUMENTS

| | | | |
|---|---|---|---|
| 2010/0159695 A1* | 6/2010 | Chang | H01L 27/124 438/669 |
| 2011/0001909 A1 | 1/2011 | Tseng et al. | |
| 2011/0102724 A1* | 5/2011 | Ono | G02F 1/133514 349/143 |
| 2014/0054581 A1* | 2/2014 | Song | H01L 27/124 257/43 |
| 2015/0160761 A1* | 6/2015 | Lee | G06F 3/0412 345/174 |
| 2015/0249054 A1* | 9/2015 | Tian | H01L 23/544 257/797 |
| 2016/0091642 A1* | 3/2016 | Sakaigawa | G02B 5/201 349/65 |
| 2016/0148838 A1* | 5/2016 | Shu | G02F 1/133345 438/151 |
| 2016/0246427 A1* | 8/2016 | Ming | G06F 3/044 |
| 2016/0284732 A1* | 9/2016 | Wei | G06F 3/0443 |
| 2018/0248031 A1* | 8/2018 | Kato | H01L 29/786 |
| 2019/0095001 A1* | 3/2019 | Xie | G06F 3/0418 |
| 2020/0168675 A1* | 5/2020 | Kim | H01L 27/3276 |
| 2021/0358977 A1 | 11/2021 | Zhang | |

FOREIGN PATENT DOCUMENTS

| | | | | |
|---|---|---|---|---|
| CN | 107450224 A | | 12/2017 | |
| CN | 108321159 A | | 7/2018 | |
| CN | 111694464 A | | 9/2020 | |
| JP | 2000238447 A | | 9/2000 | |
| JP | 2001042547 A | * | 2/2001 | ........... H01L 23/544 |
| KR | 20170080231 A | * | 7/2017 | |

* cited by examiner

ARRAY SUBSTRATE AND METHOD OF MANUFACTURING THE SAME, AND DISPLAY APPARATUS

CROSS-REFERENCE TO RELATED APPLICATIONS

This application is a national phase entry under 35 USC 371 of International Patent Application No. PCT/CN2021/093430, filed on May 12, 2021, which claims priority to Chinese Patent Application No. 202010567638.9, filed on Jun. 19, 2020, which are incorporated herein by reference in their entirety.

TECHNICAL FIELD

The present disclosure relates to the field of display technologies, and in particular, to an array substrate and a method of manufacturing the same, and a display apparatus.

BACKGROUND

Liquid crystal displays (LCDs) have been widely used due to their advantages such as low power consumption, miniature size, light weight and small thickness.

SUMMARY

In an aspect, a method of manufacturing an array substrate is provided. The method includes: providing a substrate, the substrate having a display area and a bezel area; forming a gate conductive layer on a side of the substrate, the gate conductive layer including gates of a plurality of thin film transistors and at least one first alignment mark located in the bezel area; forming a source-drain conductive thin film on a side of the gate conductive layer away from the substrate; aligning a first mask and aligning a first mask and the substrate on which the gate conductive layer and the source-drain conductive thin film have been formed according to the at least one first alignment mark; patterning the source-drain conductive thin film by using the first mask as a shield to form sources and drains of the plurality of thin film transistors and at least one second alignment mark located in the bezel area, so as to obtain a source-drain conductive layer, wherein a reflectivity of the source-drain conductive layer is greater than a reflectivity of the gate conductive layer; forming a black matrix thin film on a side of the source-drain conductive layer away from the substrate; aligning a second mask and the substrate on which the gate conductive layer, the source-drain conductive layer and the black matrix thin film have been formed according to the at least one second alignment mark; patterning the black matrix thin film by using the second mask as a shield to form a black matrix, wherein orthographic projections of the plurality of thin film transistors on the substrate are located within an orthographic projection of the black matrix on the substrate; and forming a color filter layer on the substrate on which the black matrix has been formed.

In some embodiments, the source-drain conductive thin film includes a first titanium thin film, an aluminium thin film and a second titanium thin film that are sequentially stacked. Alternatively, the source-drain conductive thin film includes a silver thin film.

In some embodiments, a material of the gate conductive layer includes molybdenum.

In some embodiments, the color filter layer includes color filter portions of a plurality of colors. Forming the color filter layer, includes: sequentially forming color filter portions of each of the plurality of colors.

In some embodiments, forming color filter portions of a single color, includes: forming a color filter thin film of the single color on the substrate on which the black matrix has been formed; aligning a third mask and the substrate on which the gate conductive layer, the source-drain conductive layer, the black matrix and the color filter thin film have been formed according to the at least one second alignment mark; and patterning the color filter thin film by using the third mask as a shield to form the color filter portions of the single color.

In some embodiments, the method of manufacturing the array substrate further includes: forming a first electrode thin film on a side of the color filter layer away from the substrate; aligning a fourth mask and the substrate on which the gate conductive layer, the source-drain conductive layer, the black matrix, the color filter layer and the first electrode thin film have been formed according to the at least one second alignment mark; patterning the first electrode thin film by using the fourth mask as a shield to form a first electrode layer; forming a second electrode thin film on a side of the first electrode layer away from the substrate; aligning a fifth mask and the substrate on which the gate conductive layer, the source-drain conductive layer, the black matrix, the color filter layer, the first electrode layer and the second electrode thin film have been formed according to the at least one second alignment mark; and patterning the second electrode thin film by using the fifth mask as a shield to form a second electrode layer. The sources or the drains of the plurality of thin film transistors are electrically connected to electrodes of the first electrode layer; alternatively, the sources or the drains of the plurality of thin film transistors are electrically connected to electrodes of the second electrode layer.

In another aspect, an array substrate is provided. The array substrate includes a substrate, a plurality of thin film transistors, a black matrix and a color filter layer. The plurality of thin film transistors are disposed on a side of the substrate, and the thin film transistor includes a gate, a source and a drain. The black matrix is disposed on a side of the plurality of thin film transistors away from the substrate. Orthographic projections of the plurality of thin film transistors on the substrate are located within an orthographic projection of the black matrix on the substrate. The color filter layer is disposed on the side of the plurality of thin film transistors away from the substrate.

In some embodiments, the array substrate further includes a first electrode layer and a second electrode layer. The first electrode layer is disposed on a side of the color filter layer away from the substrate, and the first electrode layer includes a plurality of first electrodes. The second electrode layer is disposed on a side of the first electrode layer away from the substrate, the second electrode layer includes a plurality of second electrodes, and the second electrode has a plurality of slits. The first electrodes are pixel electrodes, and the second electrodes are common electrodes; alternatively, the first electrodes are common electrodes, and the second electrodes are pixel electrodes. The pixel electrode is electrically connected to the source or the drain of the thin film transistor.

In some embodiments, at least two common electrodes of the common electrodes are electrically connected to each other.

In some embodiments, the array substrate further includes: a plurality of common electrode lines disposed in a same layer as the source and the drain, or disposed in a same layer as the gate. A common electrode is electrically connected to at least one common electrode line of the plurality of common electrode lines.

In some embodiments, the common electrode is also used as a touch electrode, and the common electrode line is also used as a touch signal line.

In some embodiments, a material of the gate includes molybdenum.

In yet another aspect, a curved display apparatus is provided. The curved display apparatus includes: the array substrate as described in some of the above embodiments, an opposite substrate disposed opposite to the array substrate, and a liquid crystal layer disposed between the array substrate and the opposite substrate.

In some embodiments, in a case where a common electrode of the array substrate is also used as a touch electrode and the at least one common electrode line of the array substrate is also used as at least one touch signal line, the curved display apparatus further includes: a touch and display driver integration (TDDI) chip electrically connected to the common electrode lines. The TDDI chip is configured to: transmit a common voltage signal to the common electrode of the array substrate via the at least one common electrode line(s) in a display phase of the curved display apparatus; and transmit a touch signal to the common electrode via the at least one common electrode line in a touch phase of the curved display apparatus.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products and actual processes of methods involved in the embodiments of the present disclosure.

DETAILED DESCRIPTION

Figure 1:
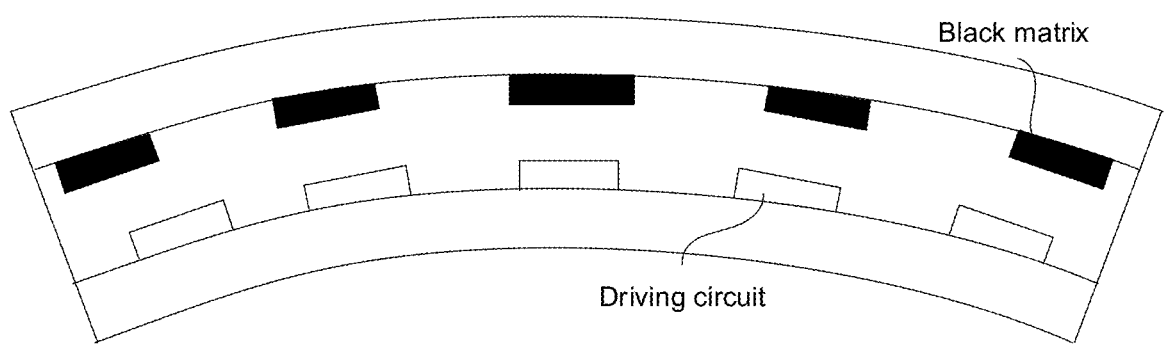
FIG. 1 is a structural diagram of a curved display apparatus in the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with the terms such as "first" and "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phrase "based on" as used herein is meant to be open and inclusive, since a process, step, a calculation or other action that is "based on" one or more of the stated conditions or values may, in practice, be based on additional conditions or values beyond those stated.

As used herein, terms such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Display screens in curved display apparatuses are generally organic light-emitting diode (OLED) display screens. However, due to limitations of OLED display screens, such as high cost and poor adaptability to different environments, curved liquid crystal displays (LCDs) have become one of the development directions of the panel industry.

For example, a LCD includes an array substrate and an opposite substrate that are disposed opposite to each other.

In the related art, the COA (color filter on array) technology is generally used to manufacture curved LCDs. Therefore, in a process of bending the LCD to form the curved LCD, it may be possible to avoid a situation that a driving circuit (disposed at a position in the array substrate proximate to the opposite substrate) in a sub-pixel is opposite to color filter portions in two sub-pixels adjacent to the sub-pixel, and thus avoid a color mixing problem.

Figure 2:
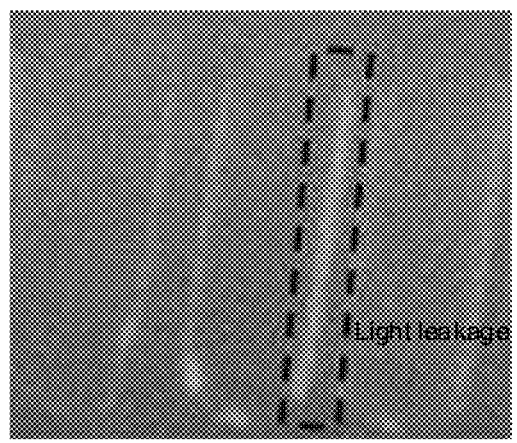
FIG. 2 is a partial schematic diagram of the display apparatus shown in FIG. 1 when displaying a black image.

However, as shown in FIG. 1, after the LCD is bent, a black matrix (disposed at a position in the opposite substrate proximate to the array substrate) and a driving circuit in a sub-pixel are prone to be misaligned. Thus, when the curved LCD displays a black image, the misaligned driving circuit is easy to reflect the external light, causing the curved LCD to have a "light leakage" problem (as shown in FIG. 2). As a result, luminance of the curved LCD when displaying the black image is increased, and contrast of the curved LCD is reduced.

Figure 13:
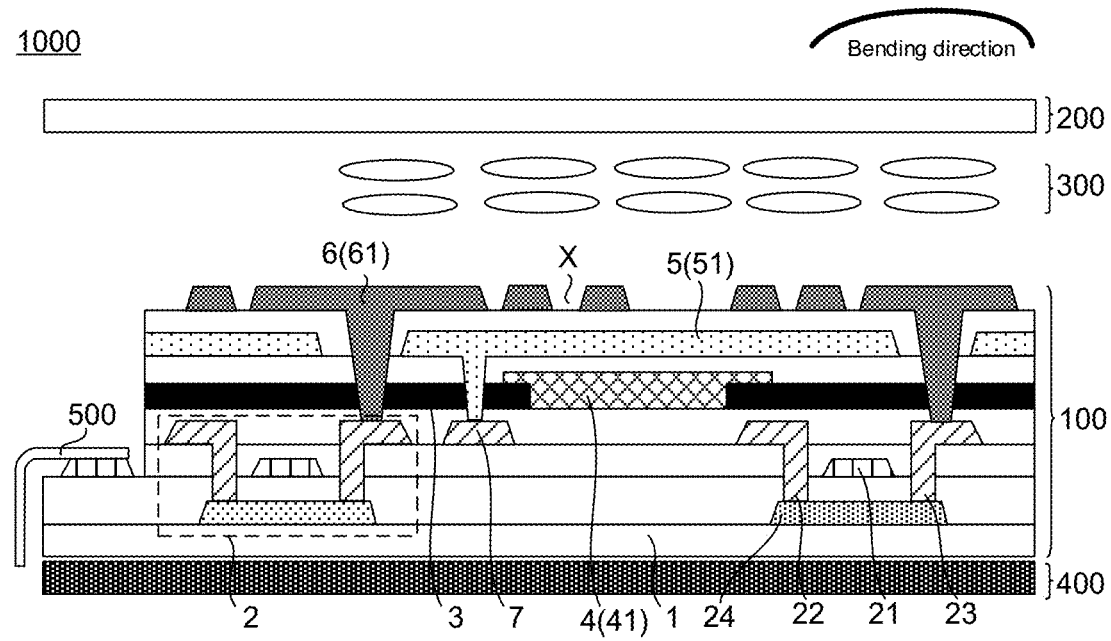
FIG. 13 is a structural diagram of a curved display apparatus, in accordance with some embodiments of the present disclosure.

In light of this, as shown in FIG. 13, some embodiments of the present disclosure provide a curved display apparatus 1000. The curved display apparatus 1000 has a curvature as a whole, and the curvature of the curved display apparatus 1000 may be set according to actual needs.

Here, a position of a center of curvature of the curved display apparatus 1000 may vary, which may be set according to actual needs.

For example, the center of curvature of the curved display apparatus 1000 is disposed at a display side of the curved display apparatus 1000. In this case, the curved display apparatus 1000 may be applied to a product or component having a display function, such as a television or a monitor.

For example, as shown in FIG. 13, the center of curvature of the curved display apparatus 1000 is disposed at a side of the curved display apparatus 1000 facing away from the display side. In this case, the curved display apparatus 1000 may be applied to a product or component having a display function, such as a billboard.

In some embodiments, as shown in FIG. 13, the curved display apparatus 1000 includes: an array substrate 100, an opposite substrate 200 disposed opposite to the array substrate 100, and a liquid crystal layer 300 disposed between the array substrate 100 and the opposite substrate 200.

The liquid crystal layer 300 includes liquid crystal molecules. The type of the liquid crystal molecules may vary, which may be set according to actual needs.

For example, the liquid crystal molecules are positive liquid crystal molecules; alternatively, the liquid crystal molecules are negative liquid crystal molecules.

In some embodiments, as shown in FIG. 13, the curved display apparatus 1000 further includes a backlight module 400. The backlight module 400 is configured to provide light for image display of the curved display apparatus 1000.

Here, the backlight module 400 includes, but is not limited to, a backlight.

The type of the backlight module 400 may vary. For example, the backlight module 400 is a direct-lit backlight module; or the backlight module 400 is an edge-lit backlight module.

A structure of the array substrate 100 in the curved display apparatus 1000 provided in some embodiments of the present disclosure will be schematically described below with reference to the accompanying drawings.

It will be noted that, in a case where the array substrate 100 provided in some embodiments of the present disclosure is applied to the curved display apparatus 1000 described above, the array substrate 100 remains curved and has a curvature, which may be equal to the curvature of the curved display apparatus 1000.

Figure 3:
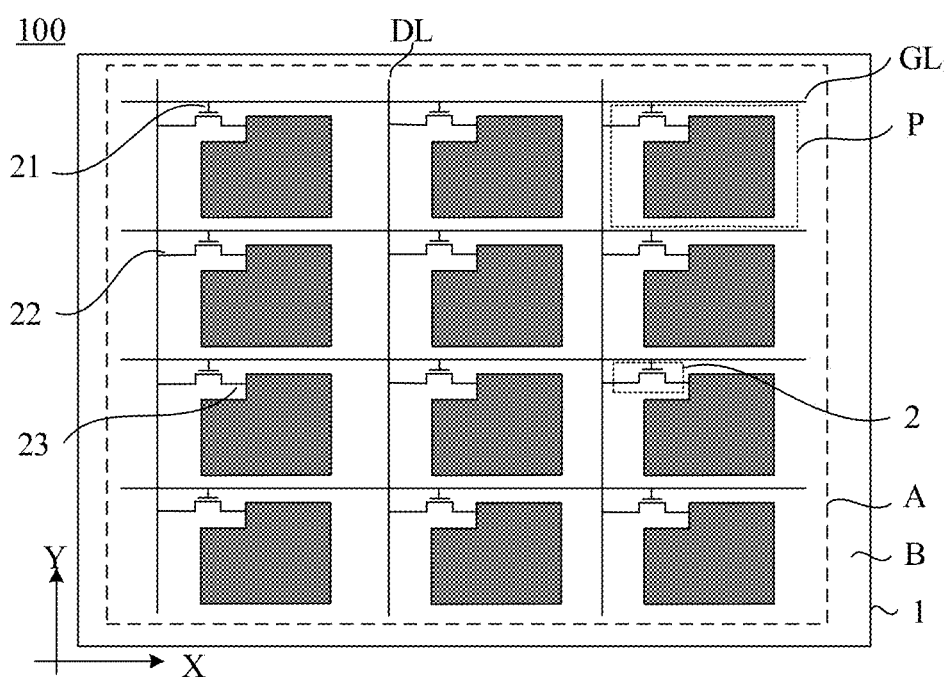
FIG. 3 is a structural diagram of an array substrate, in accordance with some embodiments of the present disclosure.
Figure 4:
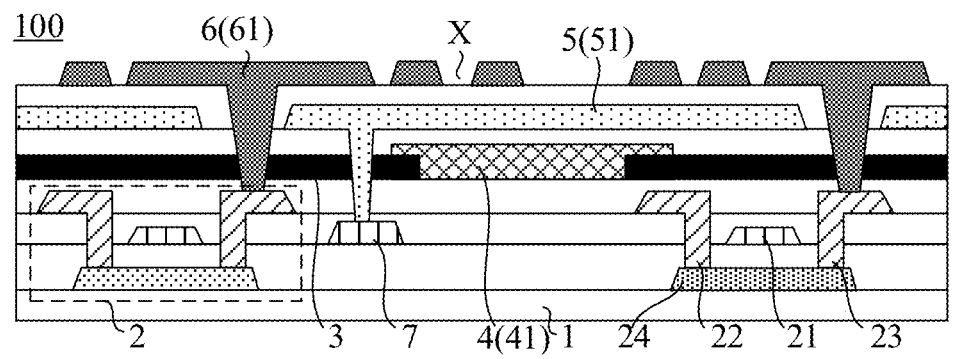
FIG. 4 is a structural diagram of another array substrate, in accordance with some embodiments of the present disclosure.
Figure 5:
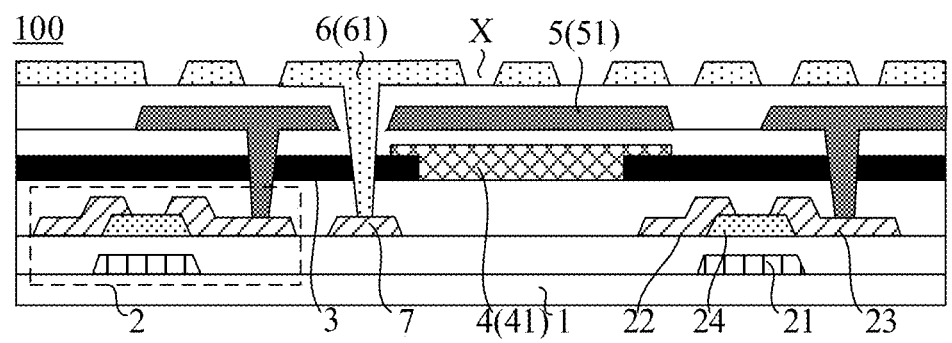
FIG. 5 is a structural diagram of yet another array substrate, in accordance with some embodiments of the present disclosure.

In some examples, as shown in FIGS. 3 to 5, the array substrate 100 includes a substrate 1.

A structure of the substrate 1 may vary, which may be set according to actual needs. For example, the substrate 1 is a blank base substrate. For another example, the substrate 1 includes a blank base substrate and functional thin film(s) (e.g., including a buffer layer) disposed on the blank base substrate.

The type of the blank base substrate may vary, which may be set according to actual needs.

For example, the blank base substrate is a rigid base substrate. The rigid base substrate may be, for example, a glass base substrate or a PMMA (polymethyl methacrylate) base substrate. In this case, the array substrate 100 may have a relatively small curvature.

For another example, the blank base substrate is a flexible base substrate. The flexible base substrate may be, for example, a PET (polyethylene terephthalate) base substrate, a PEN (polyethylene naphthalate two formic acid glycol ester) base substrate or a PI (polyimide) base substrate. In this case, the array substrate 100 may have a relatively large curvature.

In some examples, as shown in FIG. 3, the array substrate 100 has a display area A. The display area A may include, for example, a plurality of sub-pixel regions P arranged in an array.

In some examples, as shown in FIG. 3, the array substrate 100 further includes a plurality of data lines DL and a plurality of gate lines GL that are disposed on a side of the substrate 1 and located in the display area A. The plurality of data lines DL extend in a second direction Y, and the plurality of gate lines GL extend in a first direction X.

The plurality of gate lines GL and the plurality of data lines DL intersect and are insulated from each other to define the plurality of sub-pixel regions P.

Here, in the case where the substrate 1 includes the blank base substrate and the functional thin film(s) disposed on the blank base substrate, the plurality of data lines DL and the plurality of gate lines GL may be disposed on a side of the functional thin film(s) away from the blank base substrate.

In some examples, as shown in FIGS. 3 to 5, the array substrate 100 further includes a plurality of thin film transistors 2 disposed on the side of the substrate 1. Each thin film transistor 2 includes a gate 21, a source 22 and a drain 23.

For example, the plurality of thin film transistors 2 may be respectively located in the plurality of sub-pixel regions P. As shown in FIG. 3, sub-pixel regions P arranged in a row in the first direction X may be referred to as the same row of sub-pixel regions P, and sub-pixel regions P arranged in a row in the second direction Y may be referred to as the same column of sub-pixel regions P. Thin film transistors 2 in the same row of sub-pixel regions P may be electrically connected to, for example, a single gate line GL; and thin film transistors 2 in the same column of sub-pixel regions P may be electrically connected to, for example, a single data line DL. Each thin film transistor 2 may be electrically connected to a respective gate line GL via the gate 21, and electrically connected to a respective data line DL via one of the source 22 and the drain 23 (e.g., the source 22).

Of course, the thin film transistors 2 in the same row of sub-pixel regions P may be electrically connected to gate lines GL, which is not limited in the embodiments of the present disclosure.

In some examples, as shown in FIGS. 4 and 5, each thin film transistor 2 further includes an active layer 24.

A structure of the thin film transistor 2 may vary, which is related to a positional relationship between the active layer 24 and the gate 21. In the embodiments of the present disclosure, which structure of the thin film transistor 2 to adopt may be determined according to actual needs.

For example, as shown in FIG. 4, the active layer 24 is disposed at a side of the gate 21 proximate to the substrate 1. In this case, the thin film transistor 2 has a top-gate structure.

For example, as shown in FIG. 5, the active layer 24 is disposed at a side of the gate 21 away from the substrate 1. In this case, the thin film transistor 2 has a bottom-gate structure.

In some examples, as shown in FIGS. 4 and 5, the array substrate 100 further includes a black matrix 3 disposed on a side of the plurality of thin film transistors 2 away from the substrate 1.

Orthographic projections of the plurality of thin film transistors 2 on the substrate 1 are located within an orthographic projection of the black matrix 3 on the substrate 1. In addition, orthographic projections of the plurality of data lines DL and the plurality of gate lines GL included in the array substrate 100 on the substrate 1 may also be located within the orthographic projection of the black matrix 3 on the substrate 1.

In this way, the black matrix 3 may be used to cover the plurality of thin film transistors 2, the plurality of data lines DL and the plurality of gate lines GL. Therefore, it may not only be possible to block the external light passing through the opposite substrate 200 and directed toward the plurality of thin film transistors 2, the plurality of data lines DL and the plurality of gate lines GL, and thus prevent the plurality of thin film transistors 2, the plurality of data lines DL and the plurality of gate lines from reflecting the external light, but it may also be possible to block the light emitted from the backlight module 400 toward the black matrix 3, and thus avoid a light leakage problem. As a result, it may be ensured that the curved display apparatus 1000 adopting the array substrate 100 has a good display effect, and that the curved display apparatus 1000 has a relatively high contrast.

In some examples, as shown in FIGS. 4 and 5, the array substrate 100 further includes a color filter layer 4 disposed on the side of the plurality of thin film transistors 2 away from the substrate 1.

For example, the color filter layer 4 includes color filter portions 41 of a plurality of colors. The color filter portions 41 of the plurality of colors may include, but are not limited to, red color filter portions, blue color filter portions and green color filter portions.

It will be noted that, the black matrix 3 has a plurality of openings, and the color filter portions 41 of the plurality of colors included in the color filter layer 4 may be respectively disposed in the plurality of openings. Of course, as shown in FIGS. 4 and 5, an orthographic projection of the color filter portion 41 on the substrate 1 and an orthographic projection of a corresponding opening on the substrate 1 may also overlap.

In the array substrate 100 provided in the embodiments of the present disclosure, the black matrix 3 and the color filter layer 4 are sequentially disposed on the side of the plurality of thin film transistors 2 away from the substrate 1. In this way, in the case where the array substrate 100 is applied to the curved display apparatus 1000, there is no need to provide a black matrix 3 and a color filter layer 4 in the opposite substrate 200. After the array substrate 100 and the opposite substrate 200 are bent to form the curved display apparatus 1000, in addition to avoiding a misalignment between the color filter layer 4 and the thin film transistors 2, it may also be possible to avoid a misalignment between the black matrix 3 and the thin film transistors 2, a misalignment between the black matrix 3 and the gate lines GL and a misalignment between the black matrix 3 and the data lines DL. Therefore, in addition to avoiding the color mixing problem, it may also be possible to prevent the curved display apparatus 1000 from reflecting the external light when displaying a black image, prevent the luminance thereof when the black image is displayed from being increased, and thus improve the contrast of the curved display apparatus 1000.

Here, it will be noted that, in a process of forming the curved display apparatus 1000, the array substrate 100 and the opposite substrate 200 may be aligned first (at this time, the liquid crystal layer 300 is already placed between the array substrate 100 and the opposite substrate 200), and then the array substrate 100 and the opposite substrate 200 that have been aligned are bent as a whole to form the curved display apparatus 1000.

In some embodiments, as shown in FIGS. 4 and 5, the array substrate 100 further includes a first electrode layer 5 disposed on a side of the color filter layer 4 away from the substrate 1, and a second electrode layer 6 disposed at a side of the first electrode layer 5 away from the substrate 1. The first electrode layer 5 includes a plurality of first electrodes 51, and the second electrode layer 6 includes a plurality of second electrodes 61.

Here, the type of the first electrode 51 and the type of the second electrode 61 may vary, which may be set according to actual needs.

In some examples, as shown in FIG. 5, the first electrode 51 is a pixel electrode, and the second electrode 61 is a common electrode.

In this case, the plurality of first electrodes 51 may be respectively disposed in the plurality of sub-pixel regions P. That is, the first electrodes 51 may be arranged to be in one-to-one correspondence with the sub-pixel regions P. Moreover, the first electrode 51 may be electrically connected to the source 22 or the drain 23 (e.g., the drain 23) of the thin film transistor 2 in a corresponding sub-pixel region P.

The plurality of second electrodes 61 may be arranged to be in one-to-one correspondence with the plurality of sub-pixel regions P. Alternatively, at least two of the plurality of second electrodes 61 (i.e., the common electrodes) are electrically connected to each other, and the at least two second electrodes 61 are of a one-piece structure. For example, the plurality of second electrodes 61 are of a one-piece structure.

In some other examples, as shown in FIG. 4, the first electrode 51 is a common electrode, and the second electrode 61 is a pixel electrode. That is, the pixel electrode is located at a side of the common electrode away from the substrate 1. Such arrangement is conducive to increasing an intensity of an electric field between the pixel electrode and the common electrode, and improving a light transmittance of the curved display apparatus 1000.

In this case, the plurality of first electrodes 51 may be arranged to be in one-to-one correspondence with the plurality of sub-pixel regions P. Alternatively, at least two of the plurality of first electrodes 51 (i.e., the common electrodes) are electrically connected to each other, and the at least two first electrodes 51 are of a one-piece structure. For example, the plurality of first electrodes 51 are of a one-piece structure.

The plurality of second electrodes 61 may be respectively disposed in the plurality of sub-pixel regions P. That is, the second electrodes 61 may be arranged to be in one-to-one correspondence with the sub-pixel regions P. Moreover, the second electrode 61 may be electrically connected to the source 22 or the drain 23 (e.g., the drain 23) of the thin film transistor 2 in a corresponding sub-pixel region P.

In this case, since the second electrode 61 is disposed at the side of the first electrode 51 away from the substrate 1, in a case where the plurality of first electrodes 51 are of a one-piece structure (i.e., the first electrode layer 5 only includes a single pattern), the first electrode layer 5 needs to be arranged to avoid portions of the plurality of second electrodes 61, so as to make each second electrode 61 be electrically connected to a corresponding thin film transistor 2.

In some examples, as shown in FIGS. 4 and 5, the second electrode 61 has a plurality of slits X.

In an example where the first electrode 51 is the common electrode and the second electrode 61 is the pixel electrode, each pixel electrode has a plurality of slits X. By transmitting a common voltage to the first electrode 51 and transmitting a data voltage to the pixel electrode, an edge electric field may be generated between the common electrode and the pixel electrode, and the liquid crystal molecules in the liquid crystal layer 300 may be rotated to an angle due to action of the edge electric field, so that the curved display apparatus 1000 achieves image display.

In some embodiments, as shown in FIGS. 4 and 5, the array substrate 100 further includes a plurality of common electrode lines 7. Each common electrode is electrically connected to at least one common electrode line 7. The at least one common electrode line 7 is configured to transmit a common voltage to a corresponding common electrode.

In some examples, each common electrode is electrically connected to a common electrode line 7. In this way, the number of the common electrode lines 7 may be reduced, thereby reducing a space occupation of the common electrode lines 7 in the array substrate 100, and reducing a wiring complexity of the array substrate 100.

In some other examples, each common electrode is electrically connected to common electrode lines 7. In this way, in case of an abnormal connection between the common electrode and one common electrode line 7, other common electrode lines 7 may be used to transmit the common voltage to the common electrode. Such arrangement is conducive to improving a reliability of the electrical connection between the common electrode and the common electrode line 7, and a reliability of the transmission of common voltage between the common electrode and the common electrode line 7.

An arrangement manner of the plurality of common electrode lines 7 may vary, which may be set according to actual needs.

For example, as shown in FIG. 5, the plurality of common electrode lines 7 may be disposed in the same layer as the sources 22 and the drains 23. That is, the common electrode lines 7, the sources 22, the drains 23 and the data lines DL may be disposed in the same layer.

On this basis, the common electrode lines 7 may extend in the second direction Y. That is, the common electrode lines 7 are parallel or approximately parallel to the data lines DL. This may make it easier to arrange the common electrode lines 7 and the data lines DL to avoid patterns included in the array substrate 100, and prevent a cross short circuit between the common electrode lines 7 and the data lines DL, thereby ensuring a good display effect of the curved display apparatus 1000.

For example, as shown in FIG. 4, the plurality of common electrode lines 7 are disposed in the same layer as the gates 21. That is, the common electrode lines 7, the gates 21 and the gate lines GL are disposed in the same layer.

On this basis, the common electrode lines 7 may extend in the first direction X. That is, the common electrode lines 7 are parallel or approximately parallel to the gate lines GL. This may make it easier to arrange the common electrode lines 7 and the gate lines GL to avoid patterns included in the array substrate 100, and prevent a cross short circuit between the common electrode lines 7 and the gate lines GL, thereby ensuring a good display effect of the curved display apparatus 1000.

It will be noted that, the "same layer" herein refers to a layer structure formed by forming a film layer used for forming specific patterns through the same film forming process, and then using the same mask to perform a patterning process on the film layer. Depending on the specific patterns, the patterning process may include multiple exposure, development or etching processes, and the specific patterns in the formed layer structure may be continuous or discontinuous, and these specific patterns may be at different heights or have different thicknesses. In this way, a plurality of structures disposed in the same layer may be manufactured simultaneously, which simplifies a manufacturing process of the array substrate 100.

In some embodiments, the common electrode is also used as a touch electrode, and the common electrode line 7 is also used as a touch signal line. In this case, the curved display apparatus 1000 may also achieve a touch function.

In some examples of the present disclosure, the common electrode line 7 may be used to input a signal (e.g., a touch detection signal) to the common electrode, or to output a signal (e.g., a capacitance value signal) of the common electrode.

For example, the curved display apparatus 1000 provided in some embodiments of the present disclosure may be a display apparatus with a self-capacitance feature. When the human body does not touch the curved display apparatus 1000, a capacitance value of each common electrode is a fixed value; and when the human body touches the curved display apparatus 1000, a capacitance value of a common electrode corresponding to a position of the touch is a sum of the fixed value and a capacitance value of the human body. According to capacitance values of the common electrodes transmitted by the corresponding common electrode lines 7, the position of the touch may be determined by detecting a change of the capacitance value of each common electrode.

Hereinafter, other structures in the curved display apparatus 1000 provided in some embodiments of the present disclosure will be schematically described with reference to the accompanying drawings.

In some embodiments, as shown in FIG. 13, in the case where the common electrode of the array substrate 100 is used as the touch electrode and the common electrode line 7 of the array substrate 100 is used as the touch signal line, the curved display apparatus 100 provided in some embodiments of the present disclosure further includes a touch and display driver integration (TDDI) chip 500 electrically connected to the common electrode line 7.

In some examples, the TDDI chip 500 is configured to transmit a common voltage signal to the common electrode of the array substrate 100 via the common electrode line 7 in a display phase of the curved display apparatus 1000, so that the common electrode may cooperate with the pixel electrode to enable the curved display apparatus 1000 to display an image. The TDDI chip 500 is further configured to transmit a touch signal to the common electrode via the common electrode line 7 in a touch phase of the curved display apparatus 1000, so as to use the common electrode to achieve the touch function.

By providing the TDDI chip 500, it may be possible to transmit different signals to the common electrode in different phases, so that the curved display apparatus 1000 may achieve different functions. That is, the touch function and the display function are integrated together, which simplifies a structure and a manufacturing process of the curved display apparatus 1000.

In some embodiments, the curved display apparatus 1000 may be any apparatus that displays text or images whether in motion (e.g., a video) or stationary (e.g., a still image). More specifically, it is anticipated that the embodiments may be implemented in a variety of electronic apparatuses or associated with a variety of electronic apparatuses. The variety of electronic apparatuses include (but are not limited to): mobile phones, wireless apparatuses, personal digital assistants (PDAs), hand-held or portable computers, global positioning system (GPS) receivers/navigators, cameras, moving picture experts group 4 (MP4) video players, video cameras, game consoles, watches, clocks, calculators, television monitors, computer monitors, automobile displays (e.g., odometer displays), navigators, cockpit controllers and/or displays, camera view displays (e.g., displays of rear-view cameras in vehicles), electronic photos, electronic billboards or signs, projectors, building structures, packaging and aesthetic structures (e.g., displays for displaying an image of a piece of jewelry), etc.

Figure 6:
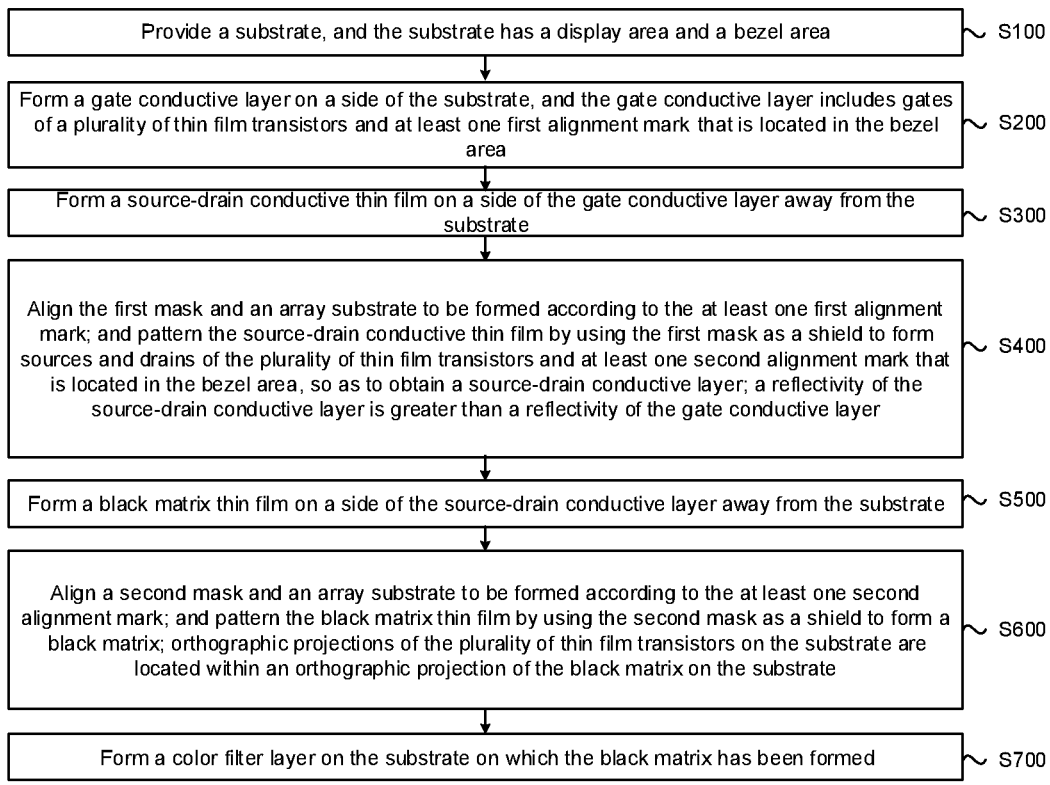
FIG. 6 is a flow diagram of a method of manufacturing an array substrate, in accordance with some embodiments of the present disclosure.

Some embodiments of the present disclosure provide a method of manufacturing an array substrate. As shown in FIG. 6, the method of manufacturing the array substrate includes S100 to S700.

In S100, a substrate 1 is provided. As shown in FIG. 3, the substrate 1 has a display area A and a bezel area B.

For example, the bezel area B may be located on one side, two sides, three sides or all sides of the display area A.

Here, as for the structure and type of the substrate 1, reference may be made to the schematic descriptions of the substrate 1 in the above embodiments, and details will not be repeated here.

Figure 9A:
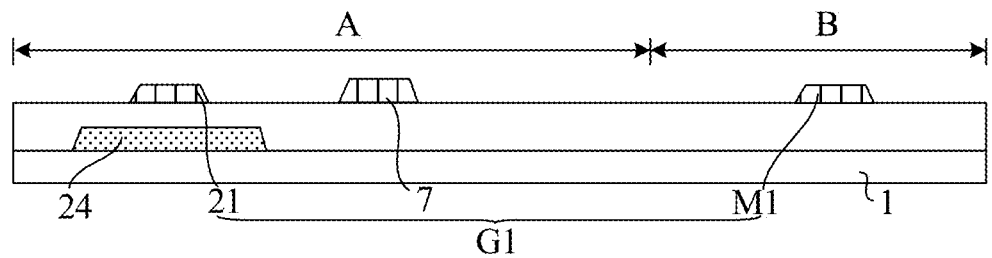
FIGS. 9a to 9j are flow diagrams showing steps of manufacturing an array substrate, in accordance with some embodiments of the present disclosure.

In S200, as shown in FIG. 9a, a gate conductive layer G1 is formed on a side of the substrate 1. The gate conductive layer G1 includes gates 21 of a plurality of thin film transistors 2 and at least one first alignment mark M1 that is located in the bezel area B.

For example, the gate conductive layer G1 may be formed by using a photolithography process or a wet etching process. A material of the gate conductive layer G1 may include, for example, molybdenum (Mo).

Here, the gates 21 of the plurality of thin film transistors 2 may be formed in, for example, the display area A.

There may be one or a plurality of first alignment marks M1, and the number of the first alignment marks M1 may be set according to actual needs.

For example, there is only one first alignment mark M1, which may reduce a wiring complexity of the array substrate 100.

For another example, there may be a plurality of first alignment marks M1, and the plurality of first alignment marks M1 may be uniformly distributed in the bezel area B. Thus, in a subsequent process of aligning a first mask F1 and an array substrate to be formed according to the first alignment mark(s) M1 in S400, an accuracy of alignment between the first mask F1 and the array substrate to be formed may be improved.

The shape of the first alignment mark M1 may vary, which may be set according to actual needs. For example, the shape of the first alignment mark M1 may include at least one of a cross, a circle, a square and a bar.

Figure 9B:
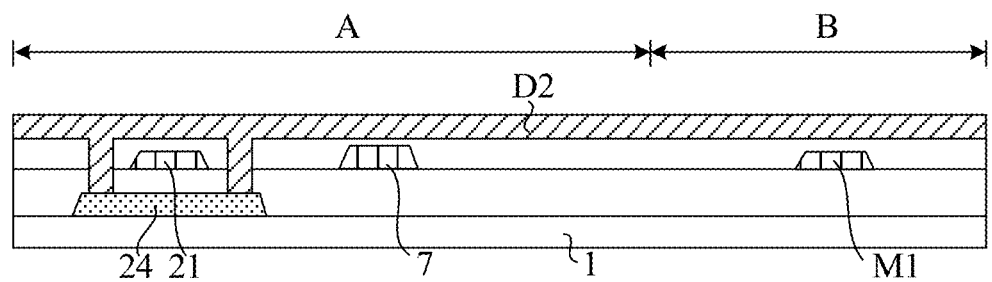

In S300, as shown in FIG. 9b, a source-drain conductive thin film D2 is formed on a side of the gate conductive layer G1 away from the substrate 1.

For example, the source-drain conductive thin film D2 may be formed by using a sputtering process. The source-drain conductive thin film D2 may be a complete thin film that is located in both the display area A and the bezel area B and covers the gate conductive layer G1.

The structure of the source-drain conductive thin film D2 may vary, which may be set according to actual needs.

For example, the source-drain conductive thin film D2 includes a first titanium (Ti) thin film, an aluminium (Al) thin film and a second titanium (Ti) thin film that are sequentially stacked. The first titanium thin film is in direct contact with the aluminium thin film, with no other thin films disposed therebetween; the aluminium thin film is in direct contact with the second titanium thin film, with no other thin films disposed therebetween.

For another example, the source-drain conductive thin film D2 includes a silver thin film. That is, a material of the source-drain conductive thin film D2 includes silver (Ag).

Figure 9C:
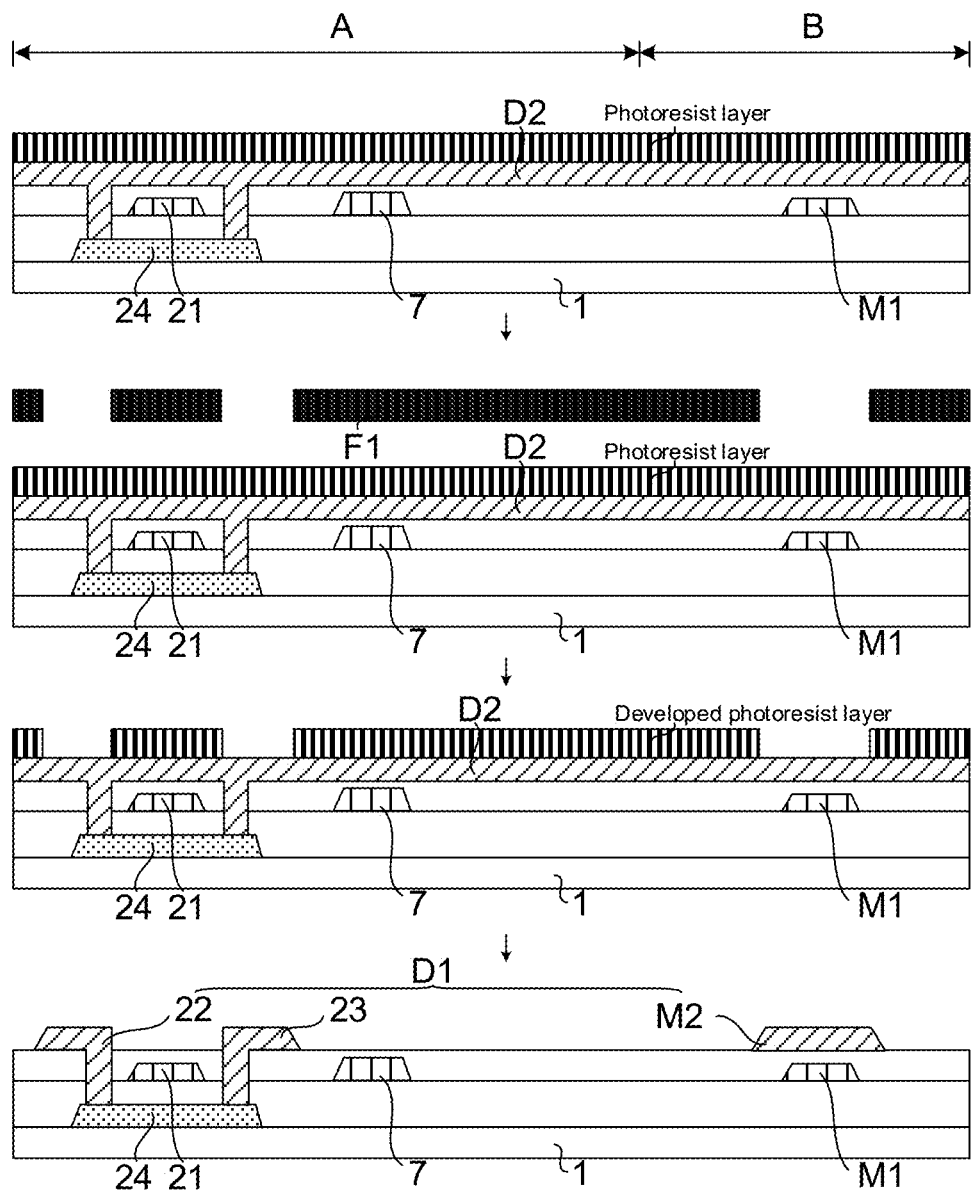

In S400, as shown in FIG. 9c, the first mask F1 and an array substrate to be formed to are aligned according to the at least one first alignment mark M1, and the source-drain conductive thin film D2 is patterned by using the first mask F1 as a shield to form sources 22 and drains 23 of the plurality of thin film transistors 2 and at least one second alignment mark M2 that is located in the bezel area B, so as to obtain a source-drain conductive layer D1. A reflectivity of the source-drain conductive layer D1 is greater than a reflectivity of the gate conductive layer G1.

For example, the source-drain conductive thin film D2 may be patterned by using a photolithography process or a wet etching process.

Here, as shown in FIG. 9c, S400 is schematically described by taking an example where the source-drain conductive thin film D2 is patterned by using the photolithography process.

In S400, patterning the source-drain conductive thin film D2 by using the first mask F1 as the shield, includes: forming a photoresist layer on a side of the source-drain conductive thin film D2 away from the substrate 1; placing the first mask F1 on a side of the photoresist layer away from the substrate 1; identifying position(s) (e.g., coordinates) of the first alignment mark(s) M1, and aligning the first mask F1 and the array substrate to be formed according to the first alignment mark(s) M1, then, exposing and developing the photoresist layer by using the first mask F1 as the shield, so that patterns of the first mask F1 are transferred to the photoresist layer; finally, etching the source-drain conductive thin film D2 by using the developed photoresist layer as a mask to form the sources 22 and the drains 23 of the plurality of thin film transistors 2 and the at least one second alignment mark M2.

Since the molybdenum included in the first alignment mark M1 has a reflectivity (i.e., a light reflectivity), in a process of identifying the position of the first alignment mark M1, a light may be cast upon the array substrate to be formed, so as to use the reflected light to determine the position of the first alignment mark M1.

For example, the number of the second alignment marks M2 may or may not be equal to the number of the first alignment marks M1. The position of the second alignment mark M2 in the bezel area B may or may not be the same as the position of the first alignment mark M1 in the bezel area B. In a case where the position of the second alignment mark M2 is the same as the position of the first alignment mark M1, the second alignment mark M2 may cover the first alignment mark M1.

Figure 9D:
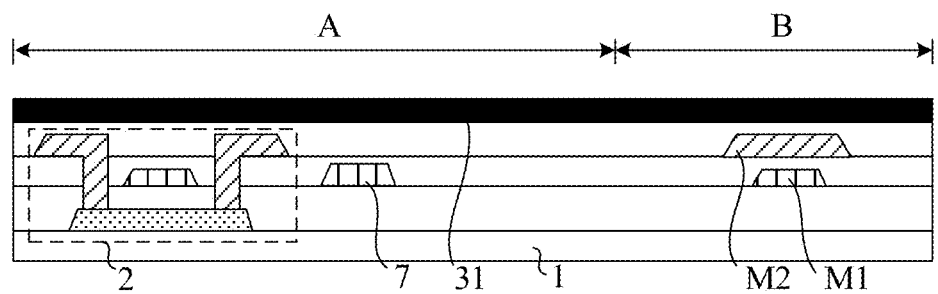

In S500, as shown in FIG. 9d, a black matrix thin film 31 is formed on a side of the source-drain conductive layer D1 away from the substrate 1.

For example, a material of the black matrix thin film 31 may include: chromium (Cr), acrylic resin doped with a black material (e.g., carbon), or photoresist doped with carbon, titanium, nickel, etc.

For example, the black matrix thin film 31 may be a complete thin film that is located in both the display area A and the bezel area B and covers the gate conductive layer G1 and the source-drain conductive layer D1.

Figure 9E:
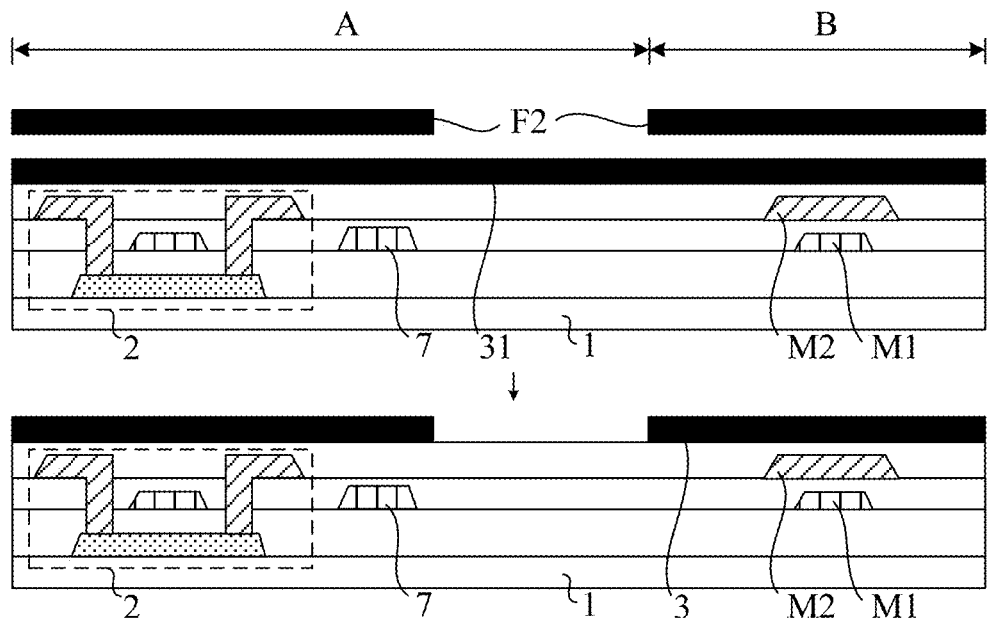

In S600, as shown in FIG. 9e, a second mask F2 and an array substrate to be formed are aligned according to the at least one second alignment mark M2, and the black matrix thin film 31 is patterned by using the second mask F2 as a shield to form a black matrix 3. Orthographic projections of the plurality of thin film transistors 2 on the substrate 1 are located within an orthographic projection of the black matrix 3 on the substrate 1.

For example, in S600, as for a process of patterning the black matrix thin film 31 by using the second mask F2 as the shield, reference may be made to the description of the process of patterning the source-drain conductive thin film D2 by using the first mask F1 as the shield in S400, and details will not be repeated here.

Here, the black matrix 3 formed after patterning the black matrix thin film 31 still covers the gate conductive layer G1 and the source-drain conductive layer D1.

Figure 10:
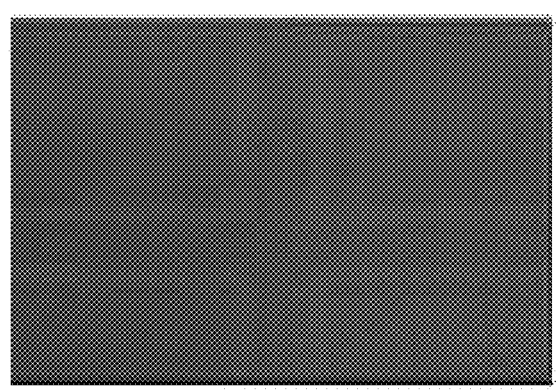
FIG. 10 is a schematic diagram of a first alignment mark after a black matrix is formed, in accordance with some embodiments of the present disclosure.
Figure 11:
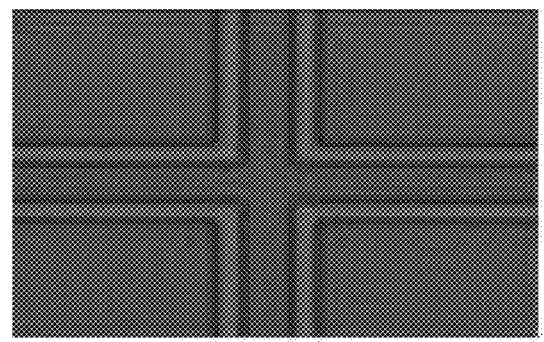
FIG. 11 is a schematic diagram of a second alignment mark after a black matrix is formed, in accordance with some embodiments of the present disclosure.
Figure 12:
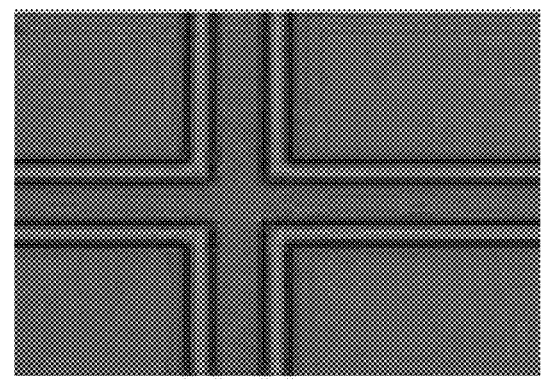
FIG. 12 is a schematic diagram of another second alignment mark after a black matrix is formed, in accordance with some embodiments of the present disclosure.

For example, the position of the first alignment mark M1 is not the same as the position of the second alignment mark M2. After the black matrix 3 is formed, an image of the first alignment mark M1 may be as shown in FIG. 10. It can be seen from the figure that, a pattern of the first alignment mark M1 is not clear, which makes it difficult to identify the first alignment mark M1. An image of the second alignment mark M2 may be as shown in FIGS. 11 and 12; FIG. 11 shows an image acquired in the case where the source-drain conductive thin film D2 includes the first titanium thin film, the aluminium thin film and the second titanium thin film that are sequentially stacked, and FIG. 12 shows an image acquired in the case where the source-drain conductive thin film D2 includes the silver thin film. It can be seen from the figures that, since the reflectivity of the source-drain conductive layer D1 is greater than the reflectivity of the gate conductive layer G1, a pattern of the second alignment mark M2 is clearer than the pattern of the first alignment mark M1, which facilitates the identification of the second alignment mark M2.

It will be noted that, in a process of forming the black matrix 3 and subsequent layers (e.g., a color filter layer 4, a first electrode layer 5 and a second electrode layer 6, etc.), if a mask and the array substrate to be formed are still aligned by using the first alignment mark M1 as an alignment reference, a situation may occur that the alignment is not accurate and it is difficult to achieve accurate exposure. However, after the black matrix thin film 31 is formed, the alignment reference is changed, and the second alignment mark M2 with a higher reflectivity is used as the alignment reference. As a result, it may be possible to facilitate the identification of the second alignment mark M2, which facilitates accurate fabrication of the subsequent layers.

Figure 9F:
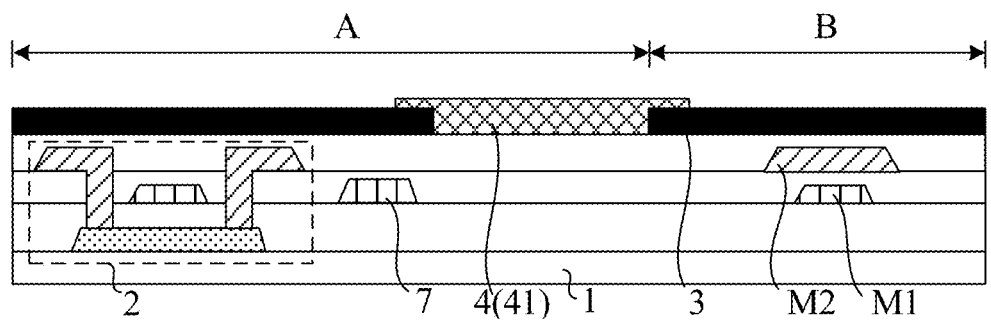

In S700, as shown in FIG. 9f, a color filter layer 4 is formed on the substrate on which the black matrix 3 has been formed.

In some examples, the color filter layer 4 includes color filter portions 41 of a plurality of colors. The color filter portions 41 of the plurality of colors may include, but are not limited to, red color filter portions, blue color filter portions and green color filter portions.

On this basis, in S700, forming the color filter layer 4, includes: sequentially forming color filter portions 41 of each of the plurality of colors.

Hereinafter, S700 is schematically described by taking the formation of color filter portions 41 of one of the plurality of colors as an example.

Figure 7:
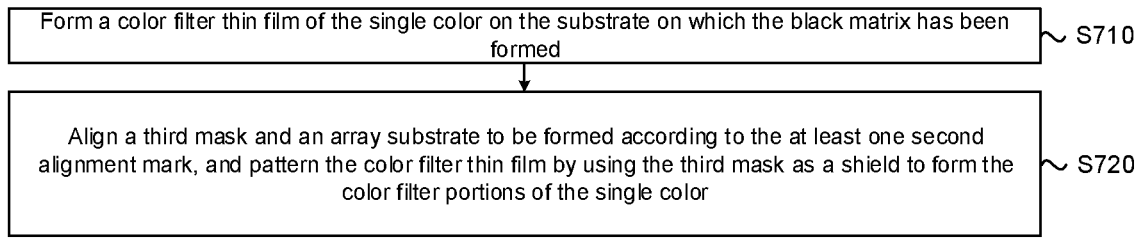
FIG. 7 is a flow diagram of S700 in FIG. 6.

For example, as shown in FIG. 7, forming color filter portions 41 of a single color, includes S710 to S720.

In S710, a color filter thin film of the single color is formed on the substrate on which the black matrix 3 has been formed.

For example, the color filter thin film may be formed by using a coating process.

In S720, a third mask and an array substrate to be formed are aligned according to the at least one second alignment mark M2, and the color filter thin film is patterned by using the third mask as a shield to form the color filter portions of the single color.

For example, in S720, as for a process of patterning the color filter thin film by using the third mask as the shield, reference may be made to the description of the process of patterning the source-drain conductive thin film D2 by using the first mask F1 as the shield in S400, and details will not be repeated here.

Thus, in the method of manufacturing the array substrate provided in the embodiments of the present disclosure, by forming the black matrix 3 and the color filter layer 4 on the side of the thin film transistors 2 away from the substrate 1, in the case where the manufactured array substrate 100 is applied to the curved display apparatus 1000, in addition to avoiding a misalignment between the color filter layer 4 and the thin film transistors 2, it may also be possible to avoid a misalignment between the black matrix 3 and the thin film transistors 2. Therefore, in addition to avoiding the color mixing problem, it may also be possible to prevent the curved display apparatus 1000 from reflecting the external light when displaying a black image, prevent the luminance thereof when the black image is displayed from being increased, and thus improve the contrast of the curved display apparatus 1000.

In addition, in the method of manufacturing the array substrate provided in the embodiments of the present disclosure, after the black matrix thin film 31 is formed, by changing the alignment reference from the first alignment mark M1 to the second alignment mark M2 with the higher reflectivity, it may be possible to facilitate the identification of the second alignment mark M2 in subsequent steps, facilitate the accurate fabrication of the subsequent thin films, and thus improve a yield of the manufactured array substrate 100 and a yield of the curved display apparatus 1000.

Figure 8:
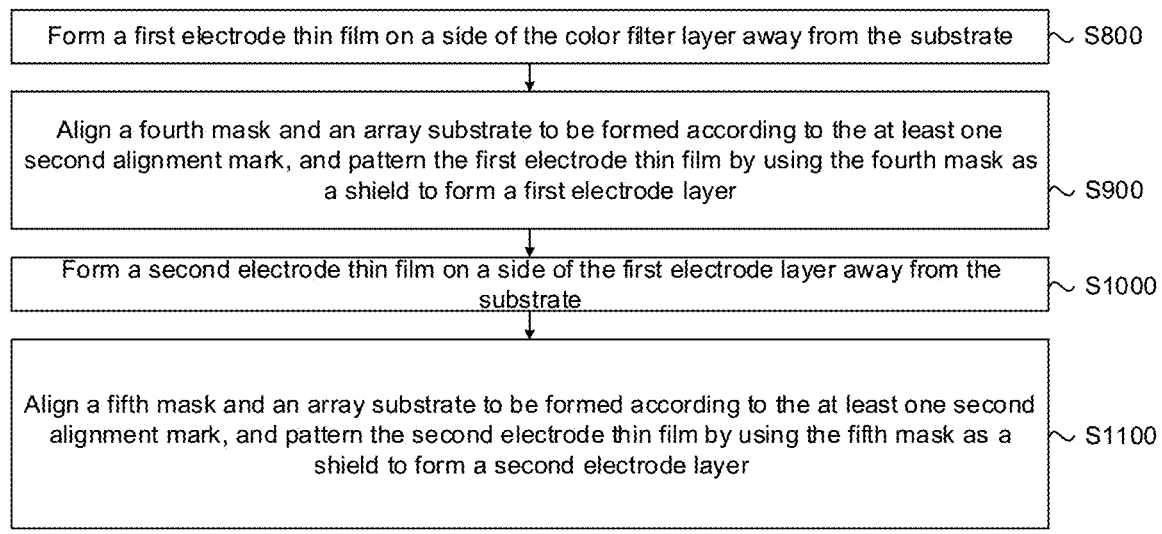
FIG. 8 is a flow diagram of another method of manufacturing an array substrate, in accordance with some embodiments of the present disclosure.

In some embodiments, as shown in FIG. 8, the method of manufacturing the array substrate further includes S800 to S1100.

Figure 9G:
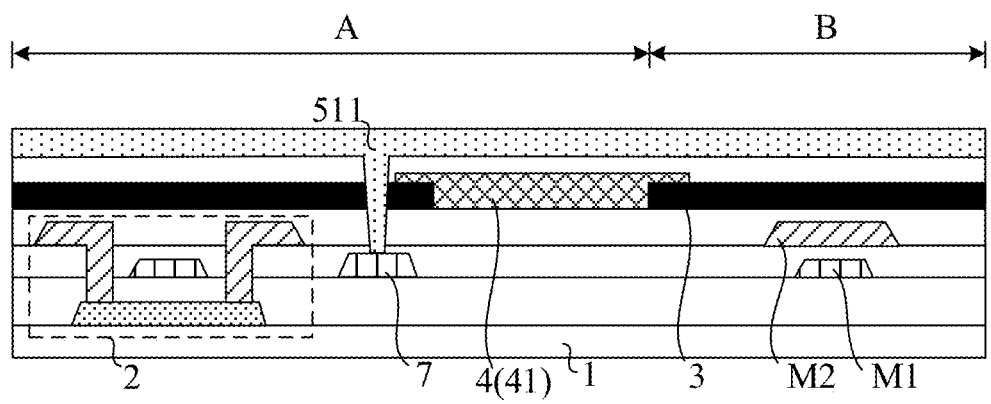

In S800, as shown in FIG. 9g, a first electrode thin film 511 is formed on a side of the color filter layer 4 away from the substrate 1.

For example, the first electrode thin film 511 may be formed by using a sputtering process. For example, the first electrode thin film 511 is made of indium tin oxide (ITO), indium zinc oxide (IZO) or indium gallium zinc oxide (IGZO).

Figure 9H:
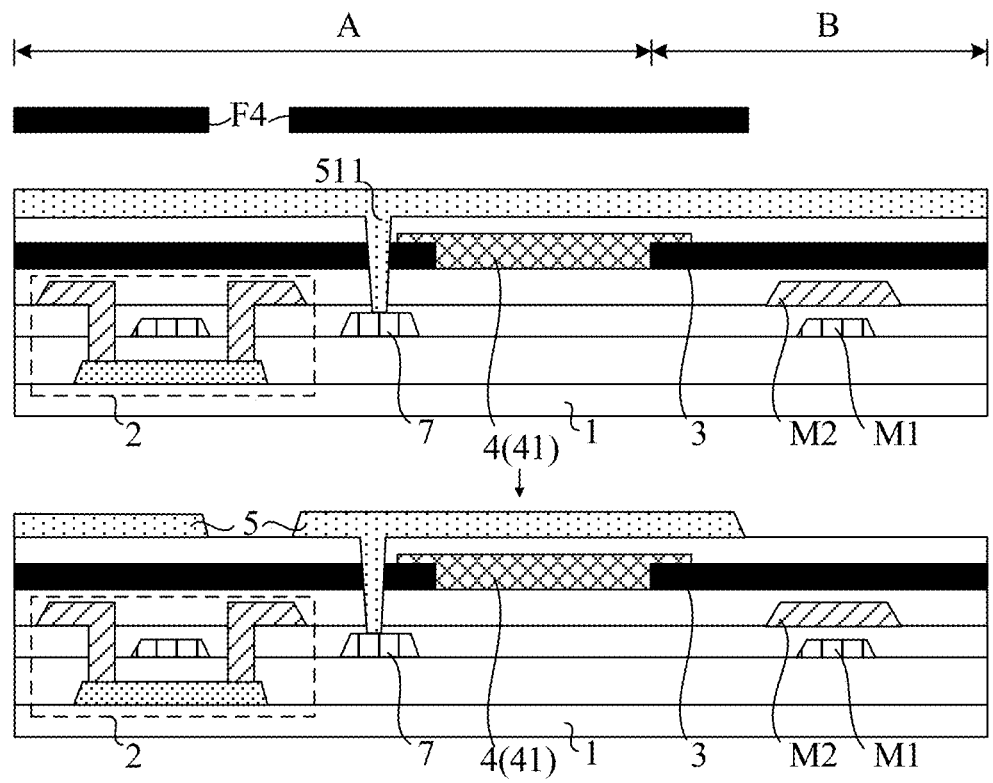

In S900, as shown in FIG. 9h, a fourth mask F4 and an array substrate to be formed are aligned according to the at least one second alignment mark M2, and the first electrode thin film 511 is patterned by using the fourth mask F4 as a shield to form a first electrode layer 5.

For example, in S900, as for a process of patterning the first electrode thin film 511 by using the fourth mask F4 as the shield, reference may be made to the description of the process of patterning the source-drain conductive thin film D2 by using the first mask F1 as the shield in S400; as for a structure of the first electrode layer 5, reference may be made to the schematic description of the structure of the first electrode layer 5 in some embodiments above; details of both will not be repeated here.

Figure 9I:
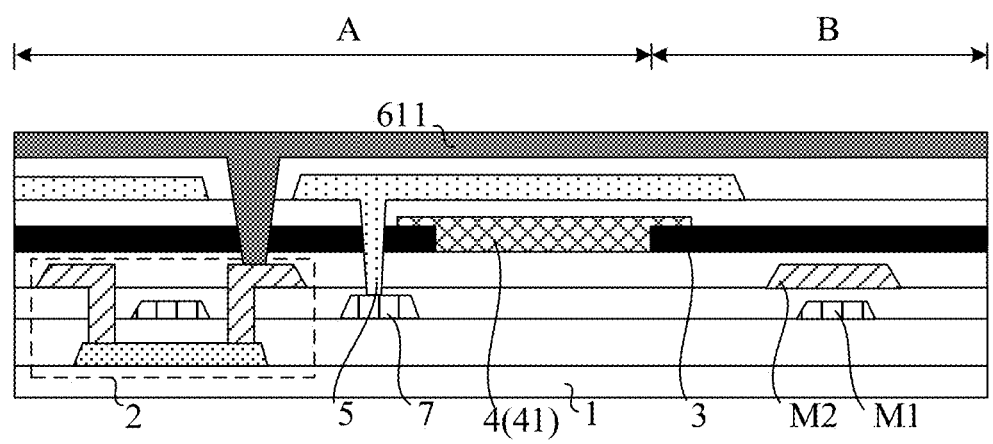

In S1000, as shown in FIG. 9i, a second electrode thin film 611 is formed on a side of the first electrode layer 5 away from the substrate 1.

For example, the second electrode thin film 611 may be formed by using a sputtering process. For example, the second electrode thin film 611 is made of ITO, IZO or IGZO.

Figure 9J:
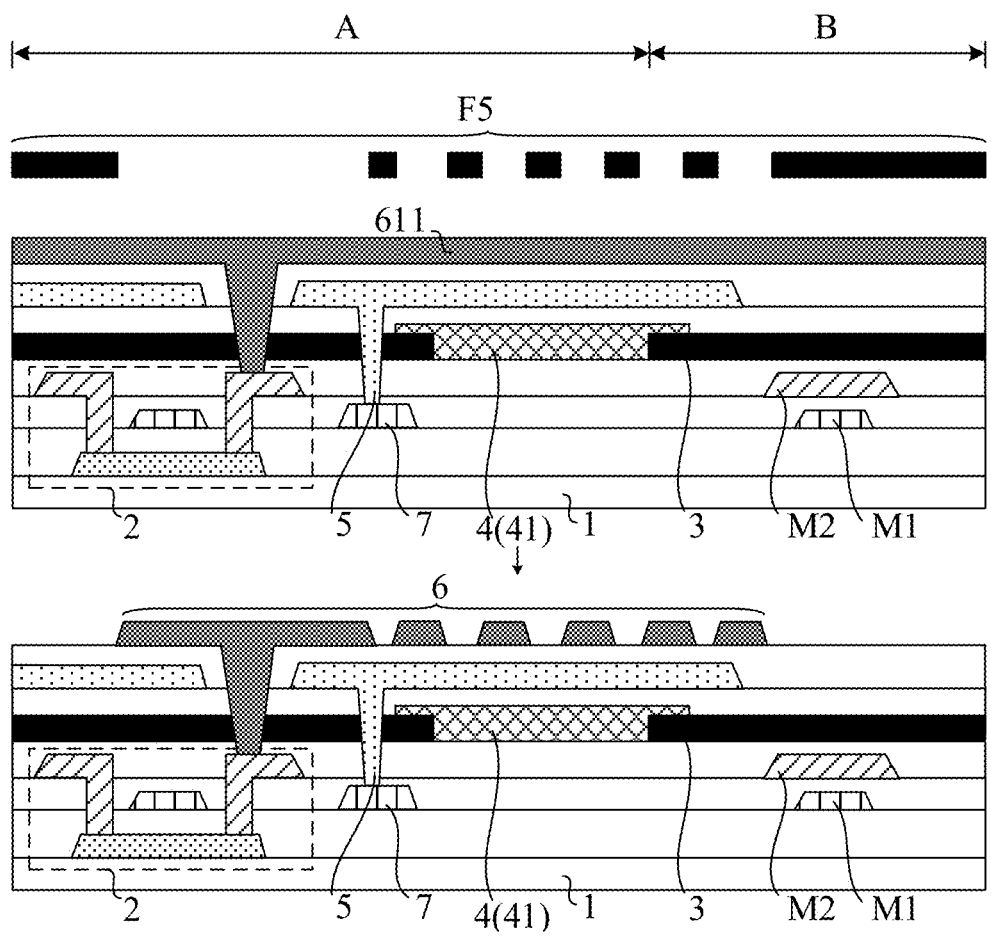

In S1100, as shown in FIG. 9j, a fifth mask F5 and an array substrate to be formed are aligned according to the at least one second alignment mark M2, and the second electrode thin film 611 is patterned by using the fifth mask F5 as a shield to form a second electrode layer 6. The sources 22 or the drains 23 of the plurality of thin film transistors 2 are electrically connected to respective electrodes of the first electrode layer 5 or the second electrode layer 6.

For example, in S1100, as for a process of patterning the second electrode thin film 611 by using the fifth mask F5 as the shield, reference may be made to the description of the process of patterning the source-drain conductive thin film D2 by using the first mask F1 as the shield in S400; as for a structure of the second electrode layer 6, reference may be made to the schematic description of the structure of the second electrode layer 6 in some embodiments above; details of both will not be repeated here.

It will be noted that, the array substrate to be formed in S400, the array substrate to be formed in S600, the array substrate to be formed in S720, the array substrate to be formed in S900 and the array substrate to be formed in S1100 have different structures.

For example, the array substrate to be formed in S400 includes at least the substrate 1, the gate conductive layer G1 and the source-drain conductive thin film D2. The array substrate to be formed in S600 includes at least the substrate 1, the gate conductive layer G1, the source-drain conductive layer D1 and the black matrix thin film 31. The array substrate to be formed in S720 includes at least the substrate 1, the gate conductive layer G1, the source-drain conductive layer D1, the black matrix 3 and the color filter thin film 411. The array substrate to be formed in S900 includes at least the substrate 1, the gate conductive layer G1, the source-drain conductive layer D1, the black matrix 3, the color filter layer 4 and a first electrode thin film 511. The array substrate to be formed in S1100 includes at least the substrate 1, the gate conductive layer G1, the source-drain conductive layer D1, the black matrix 3, the color filter layer 4, the first electrode layer 5, and the second electrode thin film 611.

Here, in the method of manufacturing the array substrate provided in the embodiments of the present disclosure, the first electrode layer 5 and the second electrode layer 6 are disposed on the side of the black matrix 3 away from the substrate 1. That is, the black matrix 3 is not disposed between the first electrode layer 5 and the second electrode layer 6, or disposed on a side of the first electrode layer 5 and the second electrode layer 6 away from the substrate 1. In this way, it may be possible to prevent the black matrix 3 (which has a resistance) from affecting an electric field generated between the first electrode layer 5 and the second electrode layer 6 and thereby affecting the display of the curved display apparatus 1000 adopting the array substrate 100.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A method of manufacturing an array substrate, the method comprising:
    providing a substrate, the substrate having a display area and a bezel area;
    forming a gate conductive layer on a side of the substrate, the gate conductive layer including gates of a plurality of thin film transistors and at least one first alignment mark located in the bezel area;
    forming a source-drain conductive thin film on a side of the gate conductive layer away from the substrate;
    aligning a first mask and the substrate on which the gate conductive layer and the source-drain conductive thin film have been formed according to the at least one first alignment mark;
    patterning the source-drain conductive thin film by using the first mask as a shield to form sources and drains of the plurality of thin film transistors and at least one second alignment mark located in the bezel area, so as to obtain a source-drain conductive layer, wherein a reflectivity of the source-drain conductive layer is greater than a reflectivity of the gate conductive layer;
    forming a black matrix thin film on a side of the source-drain conductive layer away from the substrate;
    aligning a second mask and the substrate on which the gate conductive layer, the source-drain conductive layer and the black matrix thin film have been formed according to the at least one second alignment mark;
    patterning the black matrix thin film by using the second mask as a shield to form a black matrix, wherein orthographic projections of the plurality of thin film transistors on the substrate are located within an orthographic projection of the black matrix on the substrate; and
    forming a color filter layer on the substrate on which the black matrix has been formed.

2. The method of manufacturing the array substrate according to claim 1, wherein the source-drain conductive thin film includes a first titanium thin film, an aluminium thin film and a second titanium thin film that are sequentially stacked.

3. The method of manufacturing the array substrate according to claim 1, wherein a material of the gate conductive layer includes molybdenum.

4. The method of manufacturing the array substrate according to claim 1, wherein the color filter layer includes color filter portions of a plurality of colors; and
    forming the color filter layer, includes: sequentially forming color filter portions of each of the plurality of colors.

5. The method of manufacturing the array substrate according to claim 4, wherein forming color filter portions of a single color, includes:
    forming a color filter thin film of the single color on the substrate on which the black matrix has been formed;
    aligning a third mask and the substrate on which the gate conductive layer, the source-drain conductive layer, the black matrix and the color filter thin film have been formed according to the at least one second alignment mark; and
    patterning the color filter thin film by using the third mask as a shield to form the color filter portions of the single color.

6. The method of manufacturing the array substrate according to claim 1, the method further comprising:
    forming a first electrode thin film on a side of the color filter layer away from the substrate;
    aligning a fourth mask and the substrate on which the gate conductive layer, the source-drain conductive layer, the black matrix, the color filter layer and the first electrode thin film have been formed according to the at least one second alignment mark;
    patterning the first electrode thin film by using the fourth mask as a shield to form a first electrode layer;
    forming a second electrode thin film on a side of the first electrode layer away from the substrate;
    aligning a fifth mask and the substrate on which the gate conductive layer, the source-drain conductive layer, the black matrix, the color filter layer, the first electrode layer and the second electrode thin film have been formed according to the at least one second alignment mark; and
    patterning the second electrode thin film by using the fifth mask as a shield to form a second electrode layer;
    wherein the sources or the drains of the plurality of thin film transistors are electrically connected to respective electrodes of the first electrode layer.

7. The method of manufacturing the array substrate according to claim 1, wherein the source-drain conductive thin film includes a silver thin film.

8. The method of manufacturing the array substrate according to claim 1, the method further comprising:
    forming a first electrode thin film on a side of the color filter layer away from the substrate;
    aligning a fourth mask and the substrate on which the gate conductive layer, the source-drain conductive layer, the black matrix, the color filter layer and the first electrode thin film have been formed according to the at least one second alignment mark;
    patterning the first electrode thin film by using the fourth mask as a shield to form a first electrode layer;
    forming a second electrode thin film on a side of the first electrode layer away from the substrate;
    aligning a fifth mask and the substrate on which the gate conductive layer, the source-drain conductive layer, the black matrix, the color filter layer, the first electrode layer and the second electrode thin film have been formed according to the at least one second alignment mark; and
    patterning the second electrode thin film by using the fifth mask as a shield to form a second electrode layer;
    wherein the sources or the drains of the plurality of thin film transistors are electrically connected to respective electrodes of the second electrode layer.

* * * * *